United States Patent
Harder et al.

(10) Patent No.: US 8,643,365 B2
(45) Date of Patent: Feb. 4, 2014

(54) METHOD AND MAGNETIC RESONANCE SYSTEM TO GENERATE MAGNETIC RESONANCE IMAGES

(75) Inventors: Martin Harder, Nuremberg (DE); Heiko Meyer, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 368 days.

(21) Appl. No.: 13/194,146

(22) Filed: Jul. 29, 2011

(65) Prior Publication Data

US 2012/0025824 A1 Feb. 2, 2012

(30) Foreign Application Priority Data

Aug. 2, 2010 (DE) .......................... 10 2010 038 777

(51) Int. Cl.
*G01V 3/00* (2006.01)
(52) U.S. Cl.
USPC .......................................................... 324/309
(58) Field of Classification Search
USPC ................................................. 324/300–322
See application file for complete search history.

(56) References Cited

U.S. PATENT DOCUMENTS

| | | | | |
|---|---|---|---|---|
| 5,016,637 A * | 5/1991 | Koizumi et al. | .............. | 600/419 |
| 5,298,861 A * | 3/1994 | Sugimoto | .................... | 324/306 |
| 5,374,889 A | 12/1994 | Leach et al. | | |
| 5,386,190 A * | 1/1995 | Takeuchi et al. | .............. | 324/309 |
| 5,500,593 A * | 3/1996 | Loncar et al. | ................. | 324/307 |
| 5,810,728 A * | 9/1998 | Kuhn | ............................. | 600/410 |
| 6,411,088 B1 * | 6/2002 | Kuth et al. | .................... | 324/307 |
| 6,708,054 B2 * | 3/2004 | Shukla et al. | ................. | 600/411 |
| 7,417,430 B2 | 8/2008 | Aldefeld et al. | | |
| 7,620,229 B2 * | 11/2009 | Oosawa | ........................ | 382/130 |
| 8,085,042 B2 * | 12/2011 | Graessner et al. | ............ | 324/307 |
| 8,134,364 B1 * | 3/2012 | Datzikas | ....................... | 324/307 |
| 8,427,155 B2 * | 4/2013 | Stemmer | ....................... | 324/309 |
| 2003/0173965 A1 | 9/2003 | Oesingmann | | |
| 2006/0184002 A1 | 8/2006 | Yarnykh et al. | | |

OTHER PUBLICATIONS

"Variable Field of View for Spatial Resolution Improvement in Continuously Moving Table Magnetic Resonance Imaging," Hu et al., Magnetic Resonance in Medicine, vol. 54 (2005) pp. 146-151.

* cited by examiner

*Primary Examiner* — Dixomara Vargas
(74) *Attorney, Agent, or Firm* — Schiff Hardin LLP

(57) ABSTRACT

In a method to create magnetic resonance (MR) images of a predetermined volume segment within an examination subject by operation of an MR system with continuous table displacement, at least one slice with a respective, predetermined thickness is defined, and for each slice, a partial region of the slice is selected, the respective partial region being bounded in a direction perpendicular to the thickness direction of the corresponding slice, and measurement signals are acquired from the slice, the acquired measurement signals originating from only the respective partial region of the slice.

10 Claims, 8 Drawing Sheets

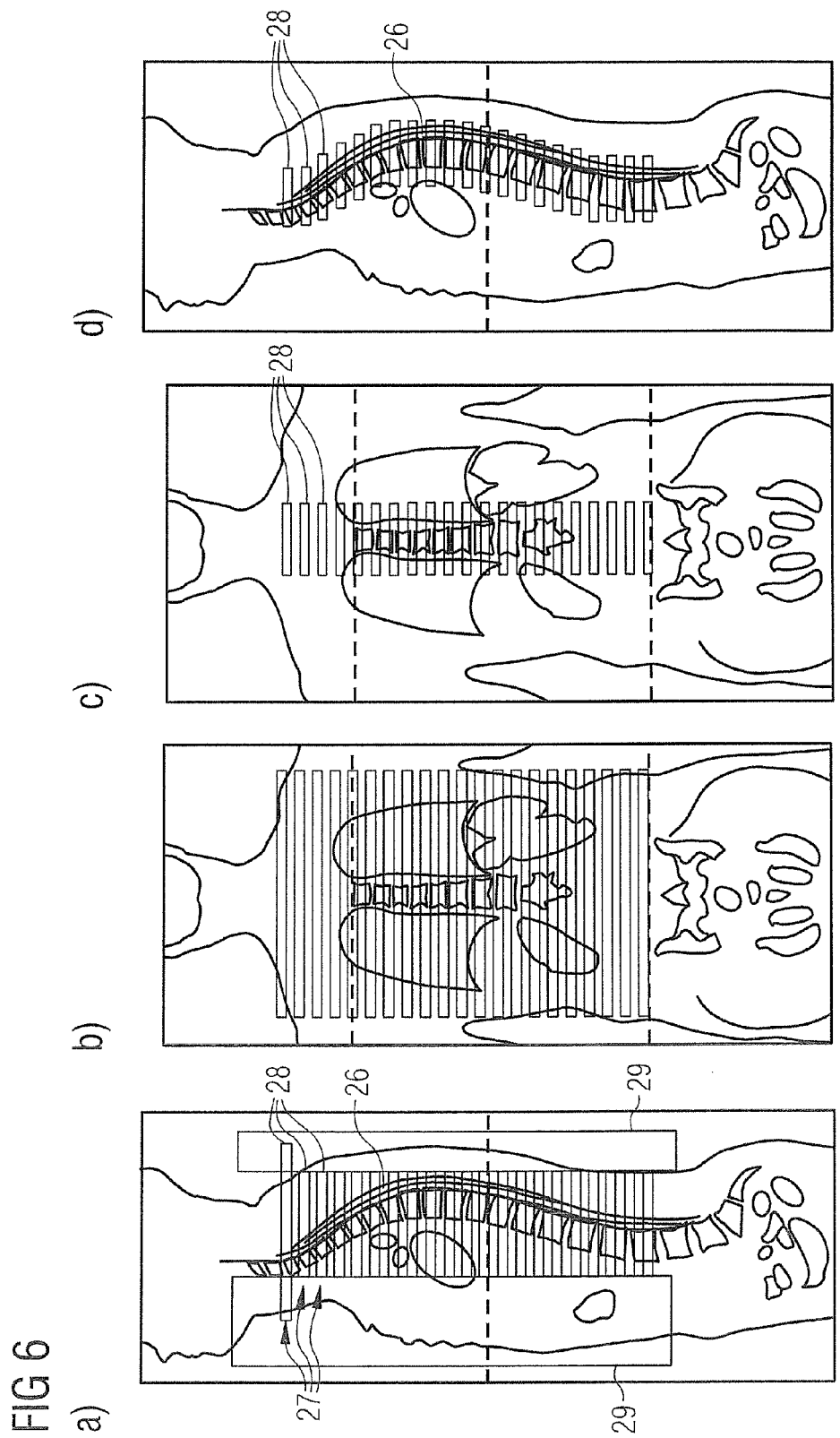

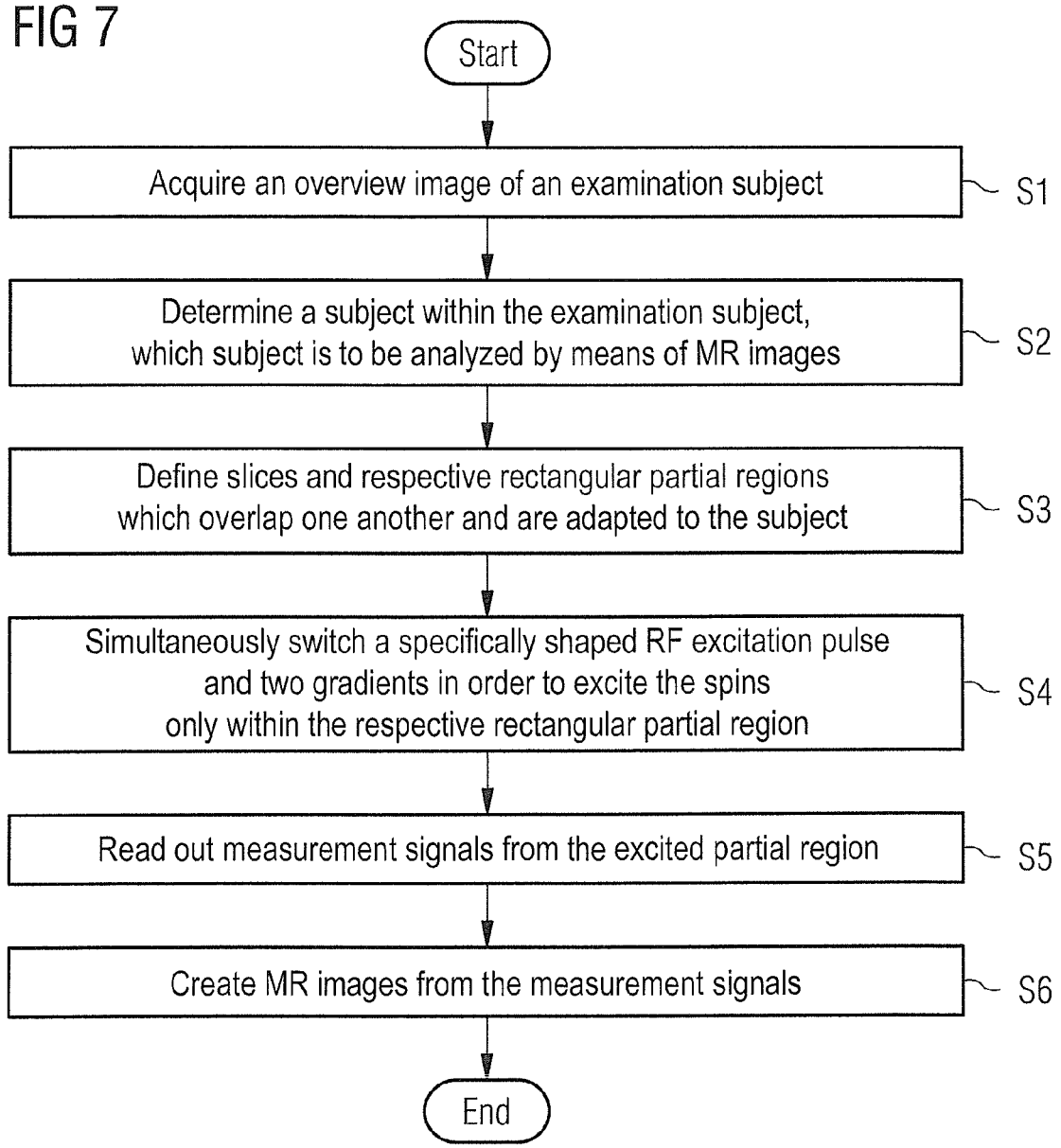

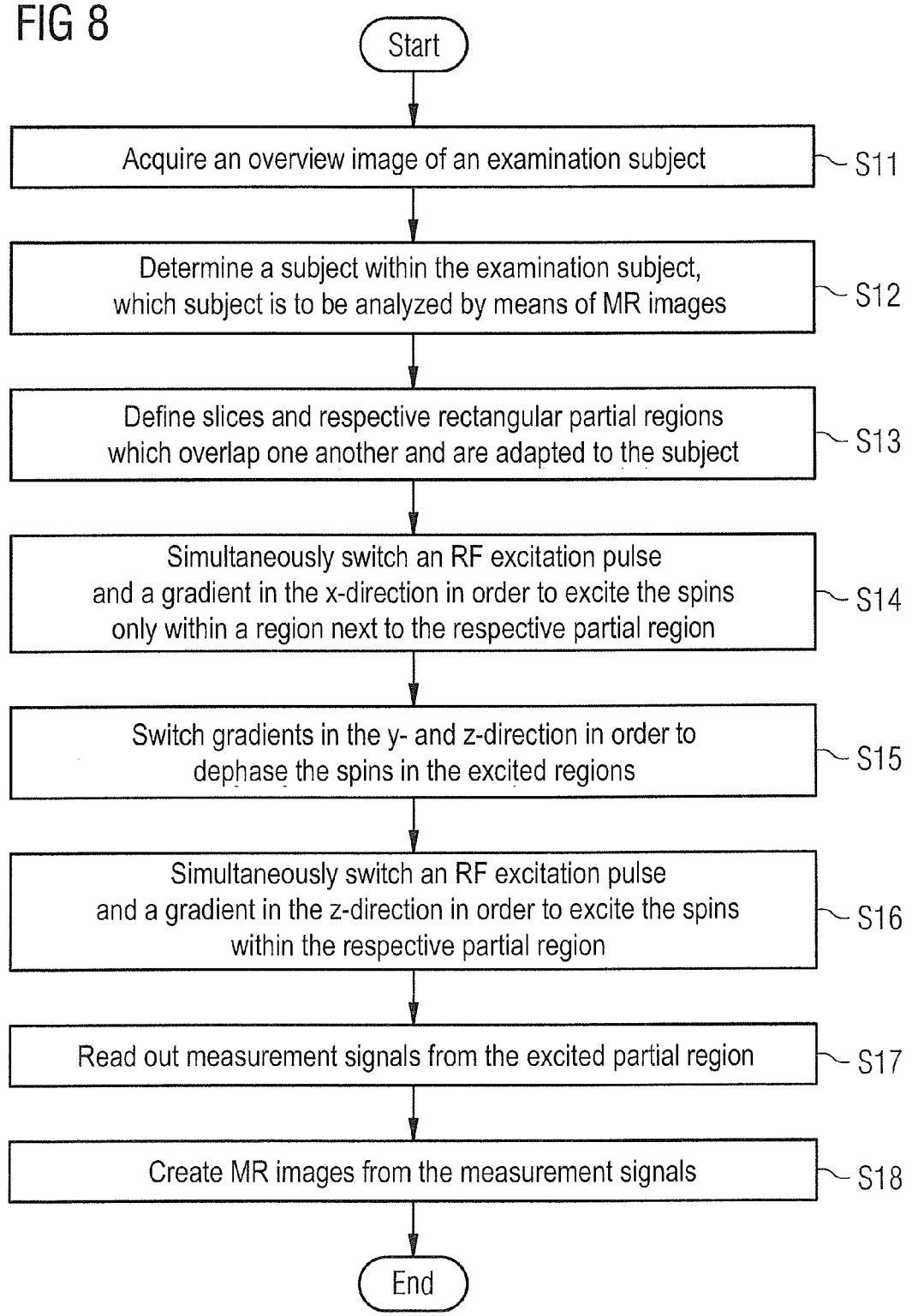

METHOD AND MAGNETIC RESONANCE SYSTEM TO GENERATE MAGNETIC RESONANCE IMAGES

BACKGROUND OF THE INVENTION

1. Field of the Invention

The present invention concerns a method to create magnetic resonance (MR) images—in particular in order to create MR images adapted to a subject given a continuous table displacement—and a correspondingly designed magnetic resonance system.

2. Description of the Prior Art

According to the prior art, to create MR images with a magnetic resonance system with continuous table displacement technology a "Field of View" (FOV) with a constant size and that is static in terms of its position relative to the magnet isocenter is used. This is also the case if anatomical structures to be shown (for example a spinal column) make up only a portion of the FOV, and therefore of the MR image to be created. Due to limiting medical, physiological or technical conditions, the dimensions in which the FOV may be smaller than the anatomy cannot always be freely selected, such that in many cases a larger FOV ("full FOV") than is necessary must be selected, i.e. a FOV that is larger than the actual anatomy of interest in at least one dimension. The FOV is the surface of a cuboid from which the MR signals are acquired. The acquisition of the measurement signals with a full FOV on the one hand disadvantageously leads to a markedly longer measurement time (time to acquire the measurement signals) since (unnecessary) measurement signals outside of the structures of interest are also acquired. The regions outside of the structures of interest which include important organs (for example liver, kidneys, heart) must be assessed, although this was not requested by the referring physician, for example.

SUMMARY OF THE INVENTION

An object of the present invention is to create MR images by operation of a magnetic resonance system with continuous table displacement technology such that the measurement time is reduced in comparison to the prior art, and optimally only structures of interest are depicted by the MR images.

The method according to the present invention for the creation of MR images of a predetermined volume segment within an examination subject (for example a patient) by means of a magnetic resonance system given continuous table displacement technology. The method includes the following steps:

1. Determine one or more slices with a respective predetermined slice thickness. The slice (if it is one slice) or the respective one of the slices (of there are multiple slices) is thereby virtually bounded at the top and bottom by two flat planes parallel to one another. A spacing of these two planes is designated as a slice thickness.

In the event that only one slice was defined in the previous Step 1, the following steps are respectively implemented only once. In the event that multiple slices were defined in the previous Step 1, the following Steps are implemented repeatedly, i.e. respectively once for each slice.

2. A respective partial region is selected or defined in each slice. The respective partial region is thereby limited in at least one direction perpendicular to the thickness direction of the corresponding slice.

3. MR measurement signals are acquired from the corresponding slice such that the acquired measurement signals originate only from the respective partial region of the corresponding slice.

4. One or more MR images are created depending on the MR measurement signals acquired in Step 3.

By limiting the partial region, the FOV can advantageously be adapted—with regard to its dimensions in the plane (perpendicular to the slice thickness direction)—to the structures of interest so that only relevant regions of the created MR images are shown. Since only measurement signals from the limited partial region must be acquired, the measurement time is also advantageously reduced.

In principle there are two possibilities (which can also be combined) in order to acquire the measurement signals from the corresponding slice such that they originate only from the respective partial region:

The regions next to the respective partial region are saturated via spatially selective saturation bands ("Outer Volume Suppression") so that the measurement signals acquired from the corresponding slice have no portion from these saturated regions. The spatial saturation of the regions next to the respective partial region occurs in order to suppress movement artifacts, aliasing artifacts or other interfering image signals.

Via a spatially selective excitation only the respective partial region is excited, such that the measurement signals acquired from the corresponding slice have only portions from this partial region.

For example, the regions next to the respective partial region can be saturated in that a gradient (which in particular is perpendicular to the surface normal of the corresponding slice) is switched simultaneously with an RF pulse, whereby spins of an additional slice which stands perpendicular to the corresponding slice are excited. Due to a subsequent dephasing of these spins, these no longer contribute to the signal in the imaging slice. In order to saturate two regions (for example one to the right next to the respective partial region and one to the left next to the respective partial region), an additional RF pulse can subsequently be switched together with the gradient perpendicular to the surface normal of the corresponding slice. For example, the spins of a section region to the right next to the respective partial region are thereby tilted by 90° first and the spins of a section region to the left next to the respective partial region within the corresponding slice are subsequently tilted by 90°. The saturation does not necessarily have to be cuboid; rather, it can assume an arbitrary shape if the saturation pulse is generated similar to as in the following possibility.

The second possibility according to the invention—i.e. the spatially selective excitation—can be realized in that what is known as a two-dimensional or three-dimensional RF pulse (also called a 2D RF pulse or, respectively, 3D RF pulse) is sent instead of a one-dimensional RF pulse. (While a one-dimensional RF pulse acts in one direction of k-space, a two-dimensional or three-dimensional RF pulse acts in two or three directions of k-space.) The two-dimensional or three-dimensional RF pulse is a modulated RF pulse that is switched simultaneously with a gradient pulse train (i.e. multiple successive gradient pulses which can also vary in their amplitude). The gradient pulse train is realized by at least two gradients standing perpendicular to one another. It is also possible that two or more gradients or gradient pulses are active simultaneously. In order to excite only the partial region (and not the entire FOV) with modulated RF pulses and gradients, according to one embodiment according to the invention a temporally varying gradient curve and associated RF pulse curve (which is then used to excite the partial region) are calculated by means of a Fourier analysis, starting from the partial region. While a temporally constant (and spatially varying) gradient field is thus switched during the RF excitation according to the prior art, according to the invention the gradients also vary over time (and not only across space) during the excitation.

According to this embodiment, the excitation volume (i.e. the partial region) can be bounded in at least two dimensions by the gradient curve and associated RF pulse curve defined by means of the Fourier analysis. The underlying approach has a certain analogy to the generation of an MR image: a trajectory in excitation space (k-space) is virtually scanned via the application of a temporally varying magnetic field gradient. A switching of one long or, respectively, multiple shorter, successive RF pulses represents a weighting along this trajectory. The resulting excitation profile (i.e. of the partial region) results from the Fourier transformation of weighted k-space. The required RF and gradient curves can be generated from the desired excitation profile by means of a Fourier analysis.

For example, if the gradient pulse train should generate a linear scanning of the partial region, the envelope of the modulated RF pulses of a two-dimensional Fourier transformation corresponds to a rectangle. The partial region is therefore scanned and only those spins are excited that are situated in a cuboid (i.e. the partial region is cuboid) which is limited in one direction and in a direction perpendicular to this (similar to as during a readout of the measurement signals of k-space). All spins outside of this cuboid (the partial region) are not affected by the modulated RF pulses and therefore do not contribute later to the measurement signals.

RF transmission pulses can be sent simultaneously with the aid of a single or multiple RF transmission coils. The use of multiple RF transmission coils allows a spatial and temporal overlapping of different RF pulses, what is known as parallel send or parallel transmit. The entirety of k-space therefore no longer needs to be scanned upon sending (analogous to parallel acquisition methods). This in particular has advantages given spatially selective RF pulses.

In comparison to one-dimensional RF pulses, the time duration for the spatially selective excitation according to the prior art is lengthened from 2-5 ms to 15-20 ms, for example. This time duration can be correspondingly shortened via the use of parallel transmit methods or via the simultaneous use of multiple (2, 8 or more, for example) RF transmission coils. Since each RF transmission antenna (or transmission coil) has its own spatial profile, the different RF pulses (defined by amplitude and phase) generated by the various RF transmission coils can be cleverly combined such that the entire excitation space (partial region) no longer needs to be scanned.

According to the prior art, acquisitions are implemented either with reduced FOV at a stationary table position or with full FOV given a moving table. A measurement with moving table offers the advantage that the measurement is always conducted in the middle of the magnet (isocenter). Geometric imaging errors that increase with distance from the isocenter and can reach orders of magnitude up to one or even multiple centimeters thereby do not affect the image. However, due to the full FOV measurements with table displacement require a longer measurement time.

According to a preferred embodiment according to the invention, the slices and the partial regions are automatically adapted to structures of interest (to the spinal column, for example) of the examination subject. For example, the slices or partial regions can be adapted automatically to the curve of the spinal column given transversal slices of said spinal column. Adaptations to the sagittal or coronary shape of the spinal column are likewise possible.

For this purpose, the respective partial regions are selected or defined such that they nearly exclusively comprise the structures of interest. In other words, the dimensions of the respective partial regions are defined in at least one dimension perpendicular to the slice thickness such that the dimensions are greater than the corresponding dimensions of the structures of interest by only a predetermined safety value.

The adaptation of the respective partial regions to the structures of interest can thereby be implemented by means of an additional MR image (for example an MR overview image) which is created by the magnetic resonance system. The structures of interest are automatically localized with the use of this additional MR image, and the respective partial regions are subsequently adapted to the localized structures of interest.

Within the scope of the present invention, a magnetic resonance system is also provided to create MR images of a predetermined volume segment in an examination subject. The magnetic resonance system thereby comprises a basic field magnet; a gradient field system; at least one RF antenna; and a control device to activate the gradient field system and the at least one RF antenna, to receive measurement signals acquired by the RF antenna or antennas, and to evaluate the measurement signals and create the MR images. The magnetic resonance system is designed such that the magnetic resonance system acquires measurement signals from one or more predetermined slices with a respective predetermined thickness. For this, for the slice or for each of these slices the magnetic resonance system selects a respective partial region from the corresponding slice. The respective partial region is bounded in at least one direction perpendicular to the thickness direction of the corresponding slice. Given acquisition of the measurement signals from the corresponding slices, the magnetic resonance system acquires measurement signals only from the respective partial region. The acquisition of the measurement signals takes place during a table movement. The magnetic resonance system creates MR images with the aid of the measurement signals.

The advantages of the magnetic resonance system according to the invention significantly correspond to the advantages of the method according to the invention that have been stated in detail above.

Furthermore, the present invention encompasses a non-transitory computer-readable storage medium encoded with programming instructions (in particular a computer program or software) that can be loaded into a memory of a programmable controller or computer of a magnetic resonance system. All or various embodiments of the method according to the invention that are described above can be executed with this medium when the computer programming instructions are executed in the controller or control device of the magnetic resonance system. The programming instructions may possibly require program means (libraries and auxiliary functions, for example) in order to realize the corresponding embodiments of the method. The software can be a source code (C++, for example) that must still be compiled (translated) and linked or that must only be interpreted, or can be an executable software code that is only to be loaded into the corresponding computer for execution.

The non-transitory storage medium can be a DVD, a magnetic tape or a USB stick on which electronically readable control information is stored, in particular software (see above).

The present invention encompasses the following combination possibilities:

- Combine a reduced (in particular rectangular) FOV with continuous table displacement technology by using spatially selective saturation bands.
- Combine a reduced (in particular rectangular) FOV with continuous table displacement technology by using a spatially selective excitation.
- Combine a reduced (in particular rectangular) FOV with continuous table displacement technology by using a spatially selective excitation which is implemented with multiple RF transmission coils (i.e. with a parallel transmit technique).
- Combine a reduced (in particular rectangular) FOV with continuous table displacement technology by using a spatially selective excitation, wherein the reduced FOV is adapted to the anatomy of structures of interest.
- Combine a reduced (in particular rectangular) FOV with continuous table displacement technology by using spatially selective saturation bands, wherein the reduced FOV is adapted to the anatomy of structures of interest.

The present invention is particularly suitable for the acquisition of MR images with continuous table displacement technology, wherein the FOV is adapted to the anatomy of the examination subject. Naturally the present invention is not limited to this preferred application field since the FOV can also be arbitrarily limited for other reasons.

BRIEF DESCRIPTION OF THE DRAWINGS

FIG. 6 shows how the slices or partial regions are adapted according to the invention to the spinal column of a patient.

FIG. 7 is a workflow diagram of a first embodiment of the method according to the invention which operates with a spatially selective excitation.

FIG. 8 is a workflow diagram of a second embodiment of the method according to the invention which operates with a spatially selective saturation.

DESCRIPTION OF THE PREFERRED EMBODIMENTS

Figure 1:
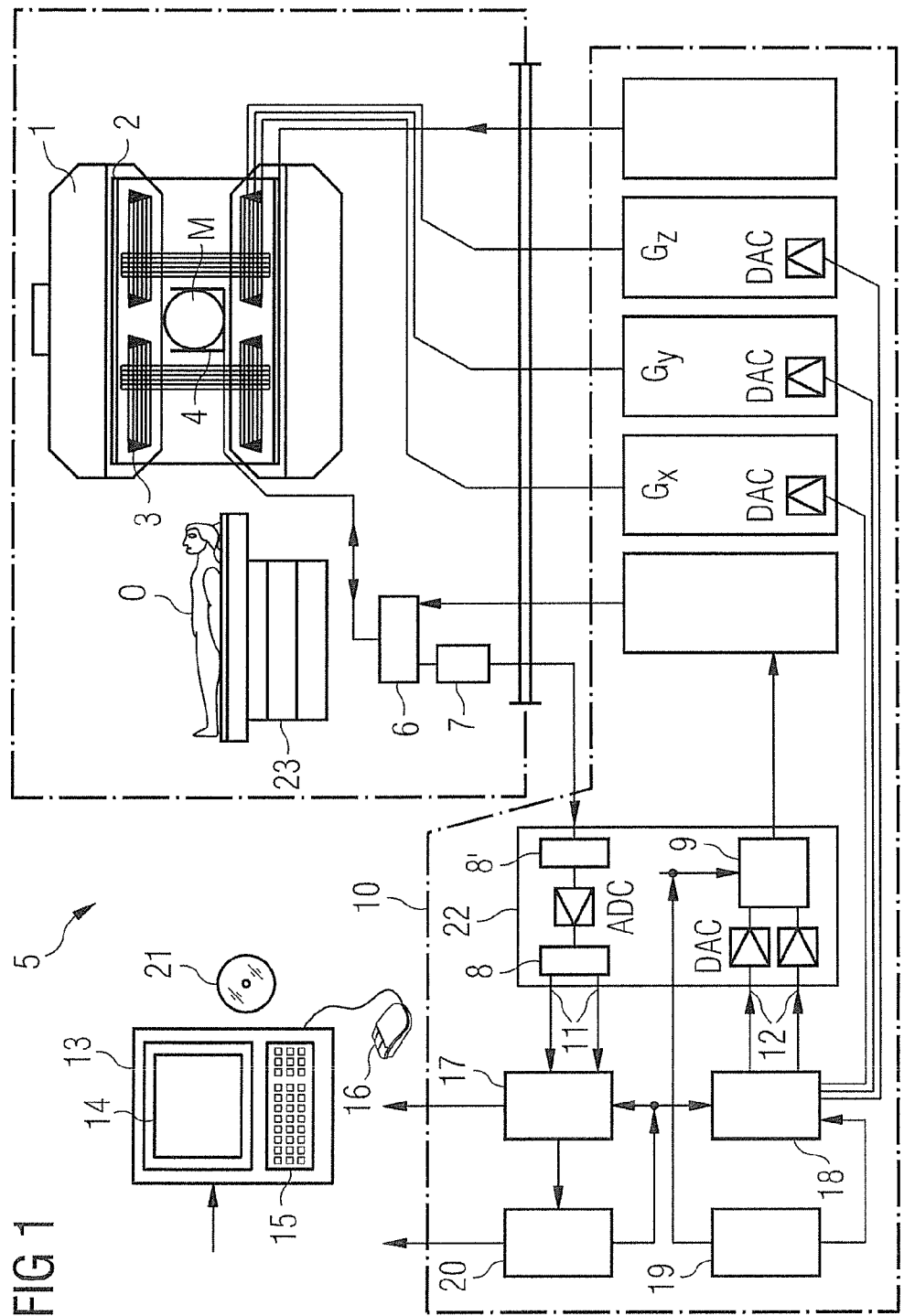
FIG. 1 schematically illustrates a magnetic resonance system according to the invention.

FIG. 1 schematically illustrates a magnetic resonance system 5 (a magnetic resonance imaging or magnetic resonance tomography apparatus). A basic field magnet 1 generates a temporally constant, strong magnetic field for polarization (alignment) of the nuclear spins in an examination region of a subject O, for example a part of a human body that is to be examined which, resting on a table 23, is continuously moved into the magnetic resonance system 5. The high homogeneity of the basic magnetic field that is required for a magnetic resonance measurement (data acquisition) is defined in a typical spherical measurement volume M through which the parts of the human body that are to be examined are continuously slid. To support the homogeneity requirements, and in particular to eliminate temporally invariable influences, shim plates made of ferromagnetic material are attached at suitable points. Temporally variable influences are eliminated by shim coils 2.

A cylindrical gradient coil system 3 that consists of three partial windings is inserted into the basic field magnet 1. Each partial winding is supplied by an amplifier with current to generate a linear (also temporally variable) gradient field in the respective direction of the Cartesian coordinate system. The first partial winding of the gradient field system 3 generates a gradient $G_x$ in the x-direction; the second partial winding generates a gradient $G_y$ in the y-direction; and the third partial winding generates a gradient $G_z$ in the z-direction. The amplifier has a digital/analog converter that is activated by a sequence controller 18 for time-accurate generation of gradient pulses.

Located within the gradient field system 3 is one (or more) radio-frequency antennas 4 which convert the radio-frequency pulses emitted by a radio-frequency power amplifier into an alternating magnetic field for the excitation of the nuclei and alignment of the nuclear spins of the subject O to be examined or, respectively, of the region of the subject O that is to be examined. Each radio-frequency antenna 4 is composed of one or more RF transmission coils and one or more RF reception coils in the form of an annular, advantageously linear or matrix-like arrangement of component coils. The alternating field emanating from the precessing nuclear spins—i.e. normally the nuclear spin echo signals caused by a pulse sequence made up of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. Based on a pulse sequence provided by the system computer 20, the respective radio-frequency pulses are thereby digitally represented in the sequence controller 18 as a series of complex numbers. This number sequence is supplied as real part and imaginary part to a digital/analog converter in the radio-frequency system 22 via a respective input 12, and from said radio-frequency system 2 to a transmission channel 9. In the transmission channel 9 the pulse sequences are modulated on a radio-frequency carrier signal whose basic frequency corresponds to the resonance frequency of the nuclear spins in the measurement volume.

The switching over from transmission operation to reception operation takes place via a transmission/reception diplexer 6. The RF transmission coils of the radio-frequency antenna(s) 5 radiate(s) the radio-frequency pulses to excite the nuclear spins in the measurement volume M, and resulting echo signals are scanned via the RF reception coil(s). The correspondingly acquired magnetic resonance signals are phase-sensitively demodulated at an intermediate frequency in the reception channel 8' (first demodulator) of the radio-frequency system 22 and digitized in the analog/digital converter (ADC). This signal is further demodulated to a frequency of 0. The demodulation to a frequency of 0 and the division into real part and imaginary part occur after the digitization in the digital domain in a second demodulator 8. An MR image is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer. The selection of corresponding control programs for the generation of an MR image (which control programs are stored on a DVD 21, for example) and the presentation of the generated MR image takes place via a terminal 13 that has a keyboard 15, a mouse 16 and a screen 14.

Figure 2:
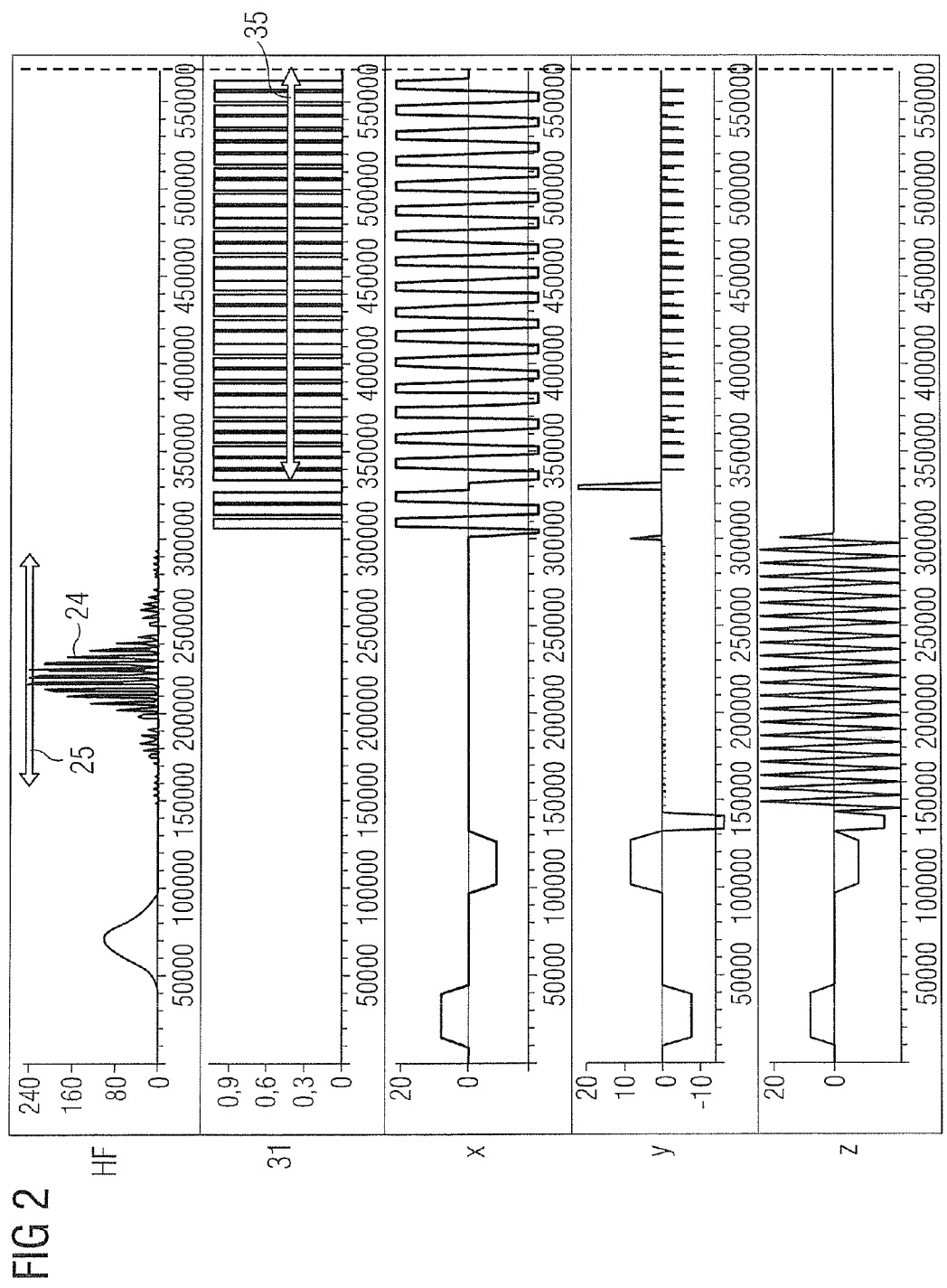
FIG. 2 is a pulse sequence diagram according to the invention for spatially selective excitation.
Figure 4:
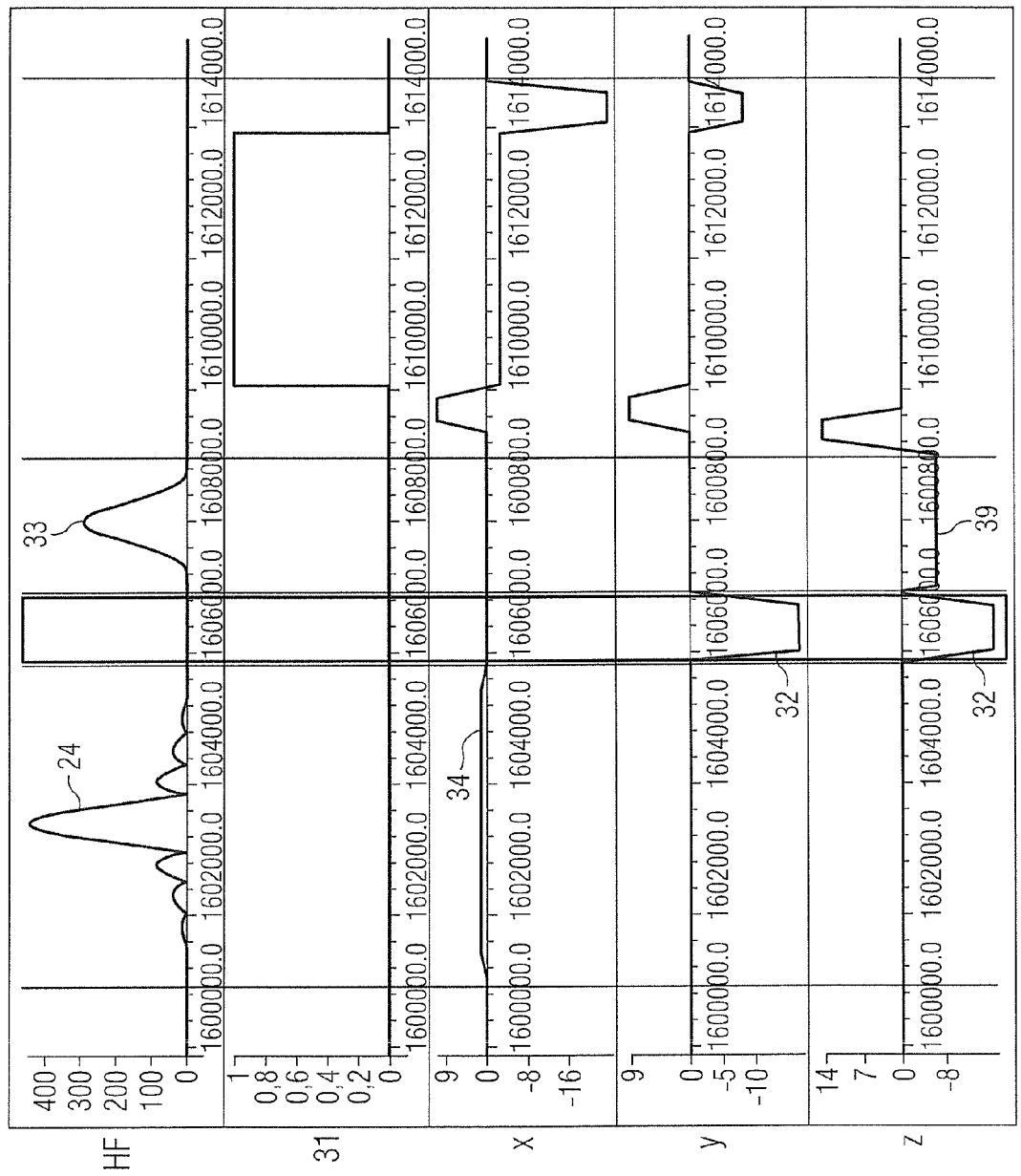
FIG. 4 shows a pulse sequence diagram for spatially selective saturation.

Shown in FIG. 2 is a pulse sequence diagram for spatially selective excitation. During the time period 25 a modulated RF pulse 24 is switched together with temporally variable gradients $G_y$ and $G_z$ in order to excite only the respective partial region 28 of the corresponding slice 27. The MR signal is subsequently read out, for example with a single shot method (EPI or HASTE, among others). An EPI ("Echoplanar Imaging") readout 35 is used for this in FIG. 2, as can be learned from the curve of the readout signal 31. Alternatively, only one or a portion of the image lines can also be respectively read out after each excitation, as shown in FIG. 4 (33, 39 and to the right of this).

According to the prior art, the entire FOV is scanned (see FIG. 3), which leads to a comparably long echo train length or a plurality of image lines to be acquired. The echo train length or the number of image lines to be acquired is shortened due to the reduction of the FOV according to the invention, i.e. via the reduction of the excitation volume in the phase coding direction (y-direction), at the cost of a longer RF pulse duration 25. Overall, the time period for the creation of the measurement signals is shortened relative to the prior art, wherein the image quality is additionally further improved given single shot methods. Since the phase coding direction (the y-direction in this example) can be freely selected, it can advantageously be arranged along the shortest dimension of the structures of interest.

Figure 3:
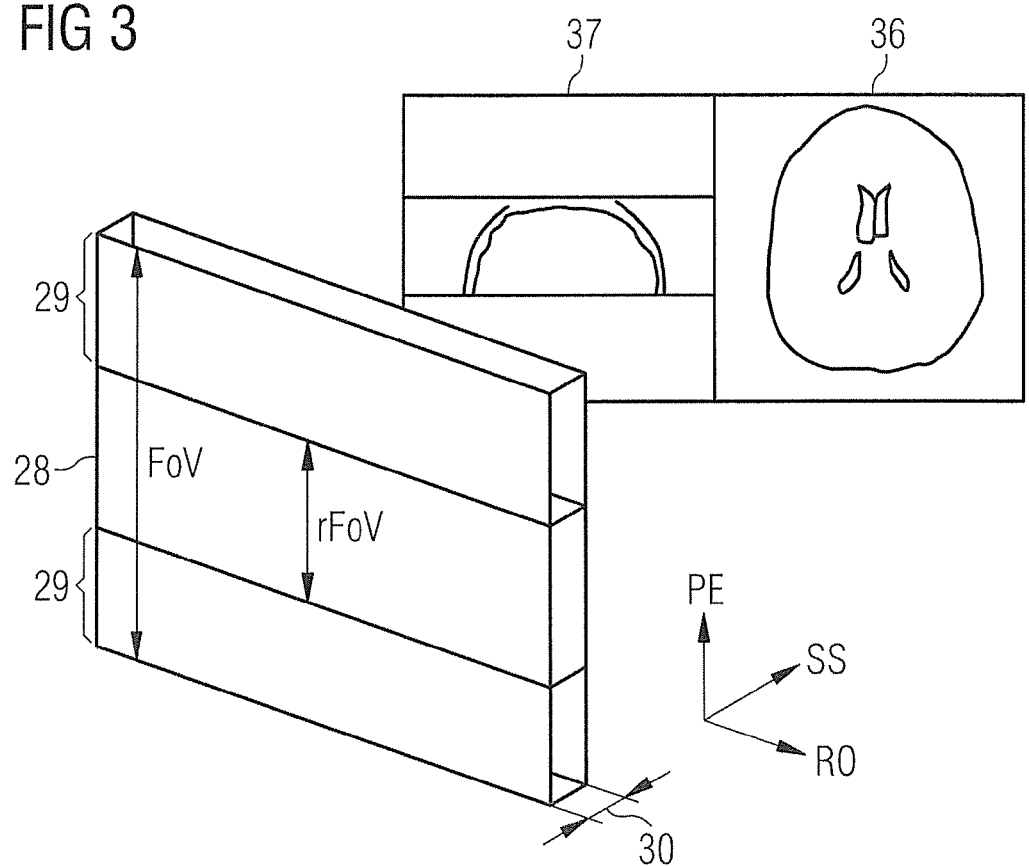
FIG. 3 schematically illustrates a comparison between an FOV according to the prior art and an FOV according to the invention.

The limited or, respectively, reduced rFOV (the partial region) 28 according to the invention is shown in FIG. 3 in comparison to the FOV according to the prior art. It is apparent that the dimensions of the FOV according to the invention in the phase coding direction PE ("Phase Encoding") are significantly smaller than the corresponding dimensions of the FOV according to the prior art. The slice thickness 30 (in slice selection direction SS) and the dimensions in the readout direction RO ("Readout") do not differ relative to the prior art. Since fewer phase coding steps must be implemented, the total measurement time is shortened compared to the prior art.

The acquisition of measurement signals in the FOV according to the prior art leads to the MR image 36, while the acquisition of measurement signals in the rFOV 28 according to the invention leads to the MR image 37. It can be recognized in the image quality of the MR image 37 that aliasing artifacts are avoided via the spatially selective excitation.

In addition to the spatially selective excitation, according to the invention a spatially selective saturation of the regions 29—which virtually represent the difference regions of the FOV according to prior art minus the rFOV 28 according to the invention—exist as an additional possibility to avoid aliasing artifacts.

An exemplary pulse sequence diagram for saturation of one of the regions 29 is shown in FIG. 4. For this a slice-selective RF pulse 24 is switched together with $G_x$ 34 in order to excite a slice 38 perpendicular to the x-direction and to tilt the magnetization of the spins in this slice 38 by 90° relative to the basic magnetic field (i.e. relative to the z-direction). Via corresponding selection of the RF pulse 24 and $G_x$ 34, the excited slice 38 comprises one of the regions 29. After the excitation, further gradients 32 (in the y-direction and z-direction) are additionally switched in order to achieve an optimally good dephasing of the spins. This procedure can be repeated to saturate the magnetization of the spins of the second region 29.

The excitation of the imaging region or slice 27 subsequently takes place with a conventional RF pulse 33 and a simultaneously switched, temporally constant $G_z$ 39, whereby the slice 27 is excited perpendicular to the z-axis (as is typical according to the prior art). Since the regions 29 next to the rFOV 28 are saturated and dephased, the spins in these regions 29 do not contribute to the subsequently acquired measurement signals.

Figure 5:
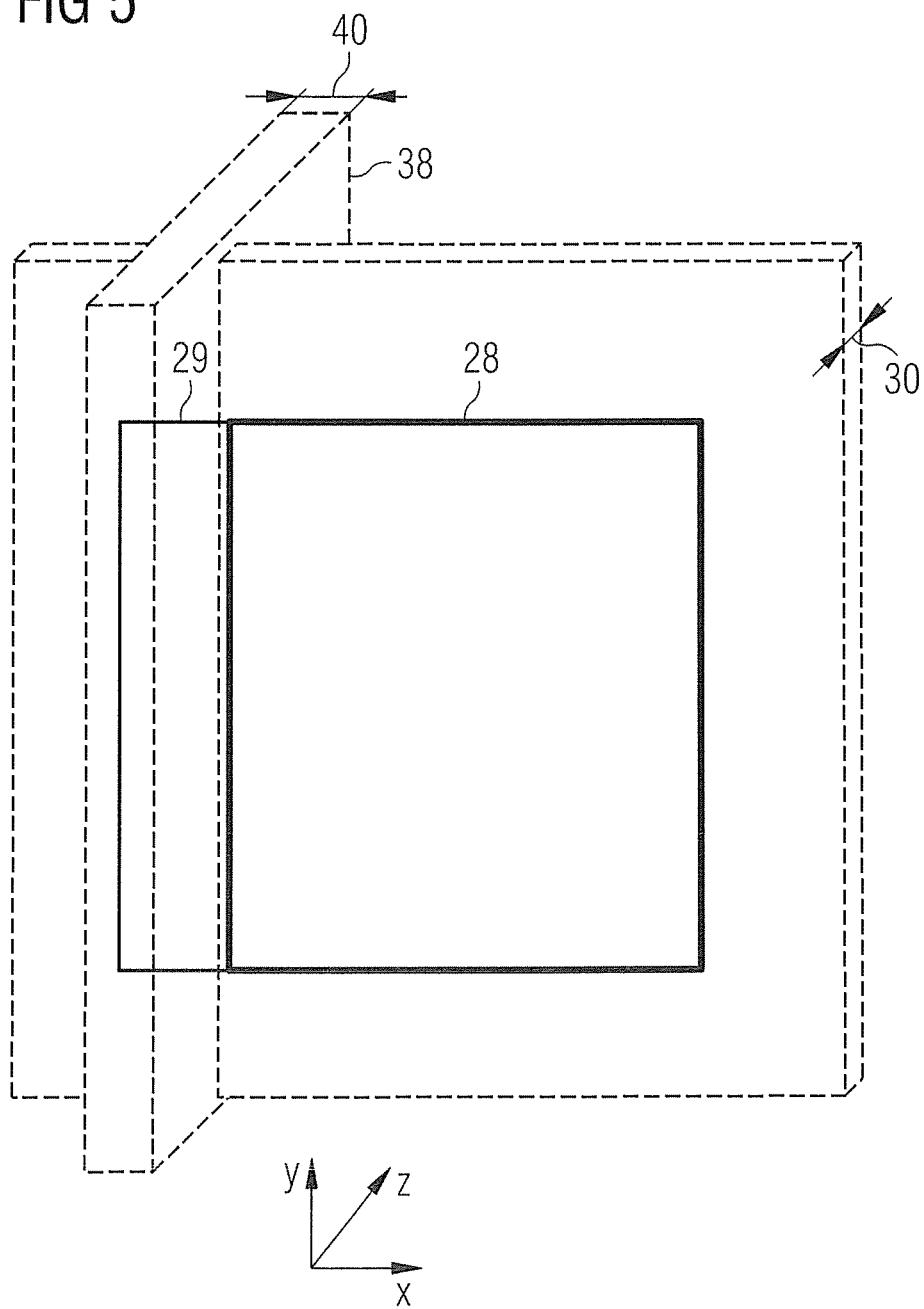
FIG. 5 shows in perspective how a boundary region of the imaged slice is saturated.

The spatially selective saturation of a region 29 is presented again in perspective in FIG. 5. The spins within the slice 38 are excited perpendicular to the x-axis via the switching of the temporally constant $G_x$ 34 simultaneously with the corresponding RF pulse 24. By corresponding selection of the slice 38 and the slice thickness 40 of the slice 38, the section region between the slice 38 and the slice 27 corresponds precisely to the region 29, whereby the spins in this region 29 are spatially selectively saturated.

The selection according to the invention of slices 27 or partial regions 28 depending on structures of interest (a spinal column in this case) is partially shown in FIG. 6 in comparison with the prior art.

In FIG. 6a the slices 27 or partial regions 28 are not arranged displaced atop one another. By means of a spatially selective saturation, those regions 29 which do not contain any portion of the spinal column 26 in a slice 27 are saturated. The respective partial region 28 of the corresponding slice 27 results from the respective slice 27 minus the respective region 29. The region 29 can thereby also be non-rectangular in shape.

Shown in comparison to this in FIG. 6b is the prior art, in which respective measurement signals are acquired from the entire slice 27, which measurement signals extend over the entire width of the body. In addition to the disadvantageously longer measurement duration, organs to the right and left near the spinal column are thereby also acquired which must then be assessed by a radiologist, for example.

In comparison to this, in FIG. 6c the procedure according to the invention is shown. It is apparent that, although the partial regions 28 comprise the spinal column 26, they do not comprise the adjacent organs.

Moreover, an embodiment according to the invention is shown in FIG. 6d, wherein the slices or partial regions 28 are displaced counter to one another, whereby they are nearly optimally adapted to the curve of the spinal column 26.

The flow chart of a first variant of the method according to the invention is shown in FIG. 7.

In a first Step S1 an overview image of a patient or examination subject O is created by means of the magnetic resonance system 5.

With this overview image a subject (the spinal column 26, for example) within the examination subject O is determined or located in the following Step S2, wherein this subject is to be analyzed by means of MR images, for example.

In the third Step S3, slices 27 are defined automatically or via a manual planning step with respective partial regions 28, wherein the slices 27 are arranged atop one another, for example, and the partial regions 28 are adapted to the subject with regard to their dimensions.

In the following Step S4 a specifically modulated RF excitation pulse 24 is switched simultaneously with two or more varying gradients of orthogonal gradients (Gy, Gz, for example) in order to spatially selectively excite the spins only within the respective rectangular partial region 28 of the corresponding slice 27.

In Step S5 measurement signals are subsequently read out from the excited partial region 28, from which measurement signals MR images are created in Step S6.

Steps S4 and S5 are respectively implemented once per slice 27 or, respectively, per partial region 28.

A flow diagram of a second variant of the method according to the invention is shown in FIG. 8.

Similar to the first variant, in Step S11 an overview image of the examination subject is created and, starting from this overview image, in Step S12 a subject within the examination subject is determined which should be analyzed by means of MR images. In the following Step S13, the slices 27 and the respective rectangular partial regions 28 are defined depending on this subject such that they overlap one another, and the partial regions 28 are adapted to the subject 26 in terms of their dimensions.

In order to excite and saturate only the spins within the regions 29 of the corresponding slice 27 next to the respective partial region 28, in Step S14 an RF excitation pulse 24 is switched simultaneously with a temporally constant gradient 34 parallel to the imaging plane. Moreover, in the following Step S15 gradients are switched in $G_y$ and $G_z$ (for example) in order to dephase the spins in the excited regions 29.

An RF excitation pulse 33 is subsequently switched in Step S16 together with a gradient $G_z$ 39 in order to obtain signals without the region 38. In the following Step S17, the measurement signals are read out from the partial region 28 in order to create the MR images in Step S18 depending on these measurement signals.

Steps S14 through S17 are respectively implemented once for each slice 27 or for each partial region 28.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to generate a magnetic resonance image of a predetermined volume segment within an examination subject, comprising the steps of:
   through a computerized control unit of a magnetic resonance data acquisition unit, defining at least one slice of an examination subject, as a defined slice with a predetermined thickness;
   for each defined slice, selecting, via said computerized control unit, a partial region, comprising less than an entirety of said defined slice, by establishing a boundary of said partial region in a direction perpendicular to a direction of the predetermined thickness of said defined slice;
   from said computerized control unit, operating the magnetic resonance data acquisition unit with the patient supported on a table and with continuous table displacement, to acquire magnetic resonance data only from the partial region of each defined slice; and
   in an image reconstruction computer, reconstructing a magnetic resonance image of said partial region of each defined slice from said magnetic resonance data.

2. A method as claimed in claim 1 comprising operating said magnetic resonance data acquisition unit to acquire said magnetic resonance data only from the partial region of each defined slice by selectively spatially exciting nuclear spins in only said partial region of each defined slice.

3. A method as claimed in claim 2 comprising acquiring said magnetic resonance data only from said partial region of each defined slice by selectively spatially saturating nuclear spins in each defined slice that are outside of said partial region.

4. A method as claimed in claim 3 comprising selectively spatially saturating said nuclear spins in each defined slice that are outside of said partial region by activating at least one gradient in said data acquisition unit together with emission of a radio frequency pulse that is adapted to a spatial position of said region outside of said partial region, and subsequently activating at least one additional gradient to dephase nuclear spins in said region outside of said partial region.

5. A method as claimed in claim 4 comprising selectively spatially exciting only said partial region in each defined slice by activating at least two perpendicular gradients simultaneously with emission of a radio frequency pulse adapted to dimensions of the partial region in the defined slice and adapted to a spatial position of the partial region in the defined slice.

6. A method as claimed in claim 4 comprising selectively spatially exciting only said partial region in each defined slice by simultaneously emitting a plurality of radio frequency pulses respectively from a plurality of different positions with multiple radio frequency transmission coils of said magnetic resonance data acquisition unit.

7. A method as claimed in claim 1 comprising, in said computerized control unit, automatically adapting said at least one defined slice in the predetermined volume segment of the subject.

8. A method as claimed in claim 7 comprising operating said magnetic resonance data acquisition unit to obtain a magnetic resonance overview of the subject prior to defining said at least one defined slice, and automatically adapting said at least one defined slice to said predetermined volume segment in said computerized control unit by automatically localizing said at least one defined slice using said overview image.

9. A magnetic resonance system to generate a magnetic resonance image of a predetermined volume segment within an examination subject, comprising:
   a magnetic resonance data acquisition unit having a displaceable patient table;
   a control unit configured to define at least one slice of an examination subject, as a defined slice with a predetermined thickness, from which magnetic resonance data are to be acquired;
   said control unit being configured to select, for each defined slice, a partial region, comprising less than an entirety of said defined slice, by establishing a boundary of said partial region in a direction perpendicular to a direction of the predetermined thickness of said defined slice;
   said computerized control unit being configured to operate the magnetic resonance data acquisition unit with the patient supported on the patient table and with continuous displacement of said patient table, to acquire magnetic resonance data only from the partial region of each defined slice; and
   an image reconstruction computer configured to reconstruct a magnetic resonance image of said partial region of each defined slice from said magnetic resonance data.

10. A non-transitory computer-readable storage medium encoded with programming instructions, said storage medium being loaded into a computerized control and processing system of a magnetic resonance data acquisition unit that includes a displaceable patient table, said programming instructions causing said computerized control and processing system to:

allow defining of at least one slice of an examination subject, as a defined slice with a predetermined thickness;

for each defined slice, select a partial region, comprising less than an entirety of said defined slice, by establishing a boundary of said partial region in a direction perpendicular to a direction of the predetermined thickness of said defined slice;

operate the magnetic resonance data acquisition unit with the patient supported on a table and with continuous table displacement, to acquire magnetic resonance data only from the partial region of each defined slice; and reconstruct a magnetic resonance image of said partial region of each defined slice from said magnetic resonance data.

* * * * *